United States Patent
Steeples

(10) Patent No.: US 7,160,742 B2
(45) Date of Patent: Jan. 9, 2007

(54) METHODS FOR INTEGRATED IMPLANT MONITORING

(75) Inventor: Kenneth Steeples, North Billerica, MA (US)

(73) Assignee: QC Solutions, Inc., Billerica, MA (US)

( * ) Notice: Subject to any disclaimer, the term of this patent is extended or adjusted under 35 U.S.C. 154(b) by 38 days.

(21) Appl. No.: 10/894,357

(22) Filed: Jul. 19, 2004

(65) Prior Publication Data

US 2005/0074909 A1    Apr. 7, 2005

Related U.S. Application Data

(60) Provisional application No. 60/488,935, filed on Jul. 21, 2003.

(51) Int. Cl.
*H01L 21/66* (2006.01)
(52) U.S. Cl. .................... 438/17; 438/510; 250/491.1; 250/492.2
(58) Field of Classification Search .............. 438/17, 438/510; 250/491.1, 492.2
See application file for complete search history.

(56) References Cited

U.S. PATENT DOCUMENTS

| | | | |
|---|---|---|---|
| 3,850,508 A | 11/1974 | Sittig et al. |
| 4,393,348 A | 7/1983 | Goldstein et al. |
| 4,498,772 A | 2/1985 | Jastrzebski et al. |
| 4,544,887 A | 10/1985 | Kemieniecki |
| 4,563,642 A | 1/1986 | Munakata et al. |
| 4,567,431 A | 1/1986 | Goodman |
| 4,598,249 A | 7/1986 | Goodman et al. |
| 4,633,138 A | 12/1986 | Tokiguchi et al. |
| 4,642,565 A | 2/1987 | Jastrzebski et al. |
| 4,758,786 A | 7/1988 | Hafeman |
| 4,841,239 A | 6/1989 | Foell et al. |
| 4,902,967 A | 2/1990 | Flesner |
| 4,956,603 A | 9/1990 | Russo |
| 4,963,815 A | 10/1990 | Hafeman |
| 5,025,145 A | 6/1991 | Lagowski |
| 5,091,691 A | 2/1992 | Kamieniecki et al. |
| 5,114,171 A | 5/1992 | D'Antonio |
| 5,177,351 A | 1/1993 | Lagowski |
| 5,216,362 A | 6/1993 | Verkuil |
| 5,369,495 A | 11/1994 | Lagowski |
| 5,418,172 A | 5/1995 | Falster et al. |

(Continued)

FOREIGN PATENT DOCUMENTS

EP        0686995        12/1995

(Continued)

OTHER PUBLICATIONS

"Monitoring of Heavy Metal Contamination during Chemical Cleaning with Surface Photovoltage," by L. Jastrzebski et al., J. Electrochem. Soc., vol. 140, No. 4, Apr. 1993, pp. 1152-1159.

(Continued)

*Primary Examiner*—M. Wilczewski
*Assistant Examiner*—Seth Barnes
(74) *Attorney, Agent, or Firm*—Kirkpatrick & Lockhart Nicholson Graham, LLP

(57) ABSTRACT

The invention relates to a method for real-time in-situ implantation and measurement incorporating a feedback loop to adjust the implantation dose of a substrate during the manufacturing and testing of semiconductor wafers. During processing, the substrate, such as a silicon wafer, is transported between a measuring device and an implantation device multiple times to ensure that where the beam from the implantation device hits the substrate, the doping concentration falls within the range of desired parameters.

15 Claims, 9 Drawing Sheets

U.S. PATENT DOCUMENTS

| | | |
|---|---|---|
| 5,485,091 A | 1/1996 | Verkuil |
| 5,511,005 A | 4/1996 | Abbe et al. |
| 5,581,194 A | 12/1996 | Lowell |
| 5,644,223 A | 7/1997 | Verkuil |
| 5,661,408 A | 8/1997 | Kamieniecki et al. |
| 5,663,657 A | 9/1997 | Lagowski et al. |
| 5,708,365 A | 1/1998 | Yoshino et al. |
| 5,773,989 A | 6/1998 | Edelman et al. |
| 5,804,981 A | 9/1998 | Lowell et al. |
| 5,811,823 A | 9/1998 | Blake et al. |
| 5,907,764 A | 5/1999 | Lowell et al. |
| 5,943,552 A | 8/1999 | Koveshnikov et al. |
| 5,966,019 A | 10/1999 | Borden |
| 5,977,788 A | 11/1999 | Lagowski |
| 5,994,911 A | 11/1999 | Fonash et al. |
| 6,011,404 A | 1/2000 | Ma et al. |
| 6,037,797 A | 3/2000 | Lagowski et al. |
| 6,069,017 A | 5/2000 | Kamieniecki et al. |
| 6,097,196 A | 8/2000 | Verkuil et al. |
| 6,114,865 A | 9/2000 | Lagowski et al. |
| 6,157,199 A | 12/2000 | Park |
| 6,166,354 A | 12/2000 | Hause et al. |
| 6,202,029 B1 | 3/2001 | Verkuil et al. |
| 6,265,890 B1 | 7/2001 | Chacon et al. |
| 6,315,574 B1 | 11/2001 | Kamieniecki et al. |
| 6,325,078 B1 | 12/2001 | Kamieniecki |
| 6,326,220 B1 | 12/2001 | Chen et al. |
| 6,388,455 B1 | 5/2002 | Kamieniecki et al. |
| 6,489,776 B1 | 12/2002 | Stowe et al. |
| 6,512,384 B1 | 1/2003 | Lagowski et al. |
| 6,522,158 B1 | 2/2003 | Fung et al. |
| 6,538,462 B1 | 3/2003 | Lagowski et al. |
| 6,569,691 B1 | 5/2003 | Jastrzebski et al. |
| 6,597,193 B1 | 7/2003 | Lagowski et al. |
| 6,909,302 B1 | 6/2005 | Kamieniecki et al. |
| 6,911,350 B1 | 6/2005 | Tsidilkovski et al. |

FOREIGN PATENT DOCUMENTS

| | | |
|---|---|---|
| EP | 0 726 471 A2 | 2/1996 |
| EP | 0795888 | 9/1997 |
| JP | 04334859 | 11/1992 |
| WO | WO 01/86698 | 11/2001 |
| WO | 02/03053 A1 | 1/2002 |

OTHER PUBLICATIONS

QCS Application Note 1001—"Epi Overdoping Detection Using Surface Charge Profiler," QC Solutions, Inc., (date unavailable).

QCS Application Note 1002—"QCS-7200 and Product Wafers," QC Solutions, Inc., (date unavailable).

QCS 7000 "Epitaxial Process Control System", QC Solutions, Inc., (date unavailable).

International Search Report, International Application No.: PCT/US2004/023420; mailed on Jul. 6, 2005; 8 pgs.

METHODS FOR INTEGRATED IMPLANT MONITORING

PRIOR APPLICATIONS

The present application claims the benefit of U.S. Provisional Patent Application No. 60/488,935, filed Jul. 21, 2003, which is hereby incorporated by reference in its entirety.

FIELD OF THE INVENTION

The invention relates to the testing of semiconductor wafers during manufacturing and specifically to the control of beam implantation during the manufacturing of a semiconductor device.

BACKGROUND OF THE INVENTION

There are numerous individual operations, or processing steps, performed, in a strictly followed sequence, on the silicon wafer in the course of manufacturing a complex integrated circuit (IC). Each such operation must be precisely controlled in order to assure that the entire fabrication process yields integrated circuits displaying the required electrical characteristics.

Frequently, failure of an individual operation is detected only after the completion of the entire, very expensive, process of IC fabrication. Due to the very high cost of advanced IC fabrication processes, such failures result in severe financial losses to the integrated circuit manufacturer. Therefore detection of errors in the manufacturing process, immediately after their occurrence, could prevent the unnecessary continuation of the fabrication of devices which are destined to malfunction, and hence, could substantially reduce the financial losses resulting from such errors.

Process monitoring in semiconductor device manufacturing relies upon the examination of the changes which occur in certain physical and/or chemical properties of the silicon wafer upon which the semiconductor devices are fabricated or in a silicon monitor wafer (i.e. a wafer used for control or a pseudo wafer used for measurement) included within a batch of product wafers. These changes may occur following the various processing steps to which a silicon wafer is subjected and are reflected by changes in the electrical and/or optical properties of the wafer. Therefore, by monitoring selected electrical and/or optical properties of the silicon wafer in the course of IC fabrication, an effective real-time control over the manufacturing process can be accomplished.

Not all of the electrical characteristics of a completed integrated circuit can be predicted based on the measurements performed on a partially processed product or monitor wafer. Most of the characteristics however, can be predicted directly or indirectly based on the investigation of the condition of the front surface of the silicon wafer (substrate) in the course of IC manufacture. The condition of the silicon surface is very sensitive to the outcome of the individual processing steps which are applied during IC manufacturing, and hence, the measurement of the electrical properties of the substrate surface can be an effective tool by which the monitoring of the outcome of the individual processing steps can be accomplished.

Measurement of the electrical and/or optical properties of the substrate typically requires that the substrate be removed from the manufacturing system, measured and then replaced back into the manufacturing system for adjustment. Thus, determination of the electrical characteristics of a substrate resulting from IC fabrication, such as implantation, often results in a delay between the time of implantation and measurement. Providing real-time feedback from the measurement device to the tools employed during IC fabrication would improve processing efficiency and yield rates.

SUMMARY OF THE INVENTION

The invention relates to a method and apparatus for controlling implantation of a substrate, such as a silicon wafer, in real-time during the implantation process. The method includes exposing a portion of the substrate to a beam from an implanter, moving a portion of the substrate relative to a measuring device, measuring a characteristic of a portion of the substrate using the measuring device and adjusting the beam from the implanter in real-time in response to the measured characteristics. In one embodiment, the method includes moving a portion of the substrate relative to the beam from the implanter. In another illustrative embodiment, the implanter generates an ion beam. In another embodiment, the method includes exposing the substrate to the adjusted beam generated from the beam implanter. In still another embodiment, the substrate may be rotated and/or linearly moved relative to the measuring device and beam implanter. The rotation of the substrate may be more than 100 rpm and the linear movement of the frequency may be greater than 0.5 Hz. In another alternative embodiment, when real-time implantation control is not required, the measurements are stored in the memory of a computer.

The apparatus described by this invention includes an implanter, a measuring device for measuring a characteristic of a portion of a substrate, a mover for moving a portion of the substrate relative to said measuring device, and an implanter controller for adjusting a beam generated from the implanter in real-time in response to said measured characteristic. The controller is in communication with the measuring device and the implanter. In one illustrative embodiment, the implanter generates an ion beam, and in another embodiment of the apparatus, the measuring device is disposed substantially adjacent to the implanter and a shield may be disposed substantially between the implanter and the measuring device. In one embodiment, the implanter generates a neutral beam, wherein surface photo-voltage is used as the measurement for the main dose controller for the system. In yet another embodiment of the invention, the measuring device includes at least two arrays and each array has a plurality of sensors for collecting measurement characteristics of the substrate. The mover of the apparatus includes a rotatable platform and may optionally be moved in a linear direction.

BRIEF DESCRIPTION OF THE DRAWINGS

This invention is pointed out with particularity in the appended claims. The above and further advantages of this invention may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

DESCRIPTION OF THE PREFERRED EMBODIMENT

In one embodiment, the system makes use of the method and apparatus for measuring surface photovoltage (SPV), disclosed in U.S. Pat. Nos. 4,544,887 and 5,661,408 herein incorporated by reference. In this method and apparatus, a beam of light is directed at a region of the surface of a specimen of semiconductor material and the photo-induced change in electrical potential at the surface is measured. The measurement of these electrical properties may then be used to control the implant scan process through motion servo and feedback loops to the ion current integration/dose control systems.

Figure 1:
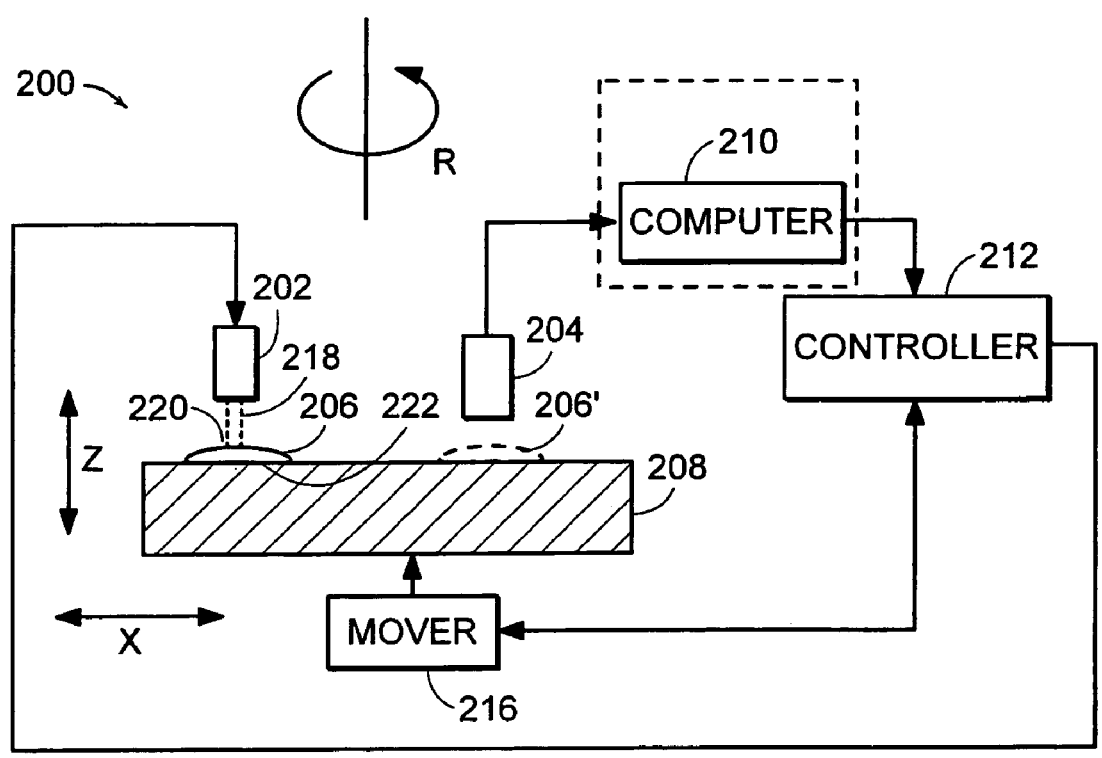
FIG. 1 is a perspective view of an embodiment the implant apparatus for wafer batch implantation and measurement incorporating a feedback loop to adjust the implantation dose.

FIG. 1 is a side perspective view of an embodiment of the implant apparatus 200 for real-time in-situ implantation and measurement incorporating a feedback loop to adjust the implantation dose of a substrate. The apparatus includes an implantation device, or beam implanter, 202, a measuring device 204, a substrate moving device 216 that is connected to a transport stage 208, a controller 212, and it optionally may include a computer 210. During processing, the substrate, such as a silicon wafer, is transported between the measuring device 204 and the implantation device 202 multiple times to ensure that where the beam from the beam implanter 202 hits the substrate, the doping concentration is within the range of the desired parameters.

In one alternative embodiment, the beam implanter generates an ion beam 218 used for implanting ions in the substrate as part of the doping process of semiconductor fabrication. Implanters for generating such ion beams are well known to one skilled in the art and include high-current implanters and high energy implanters. In an alternative embodiment, the beam implanter may generate a neutral beam as required by the implant process, thus vastly reducing the implant charging of the integrated circuit components. In this embodiment, the SPV measurement may be the primary dose control metrology for the implant system. The beam 218 dwells over the substrate as the beam implants particles into the substrate. Beam dwell times are typically on the order of one millisecond, although other suitable beam dwell times may be used.

The measuring device 204 measures electrical characteristics of a monitor substrate 206. The substrate includes two surfaces, a first surface (the front surface) 220 and a second surface 222 (the backside). Measurements are recorded by the measurement device 204 after the substrate has been scanned or implanted by the beam implanter 202. In the preferred embodiment, the measuring device is a measurement head for measuring surface photovoltage (SPV) properties of the substrate. Such a device is available from QC Solutions, Inc. of North Billerica, Mass. as 7200™ as described in U.S. Pat. Nos. 5,661,408, 6,069,017, and 6,315,574, herein incorporated by reference. As described by the incorporated references, the measurement device measures various electrical properties of the substrate and provides for the derivation of various characteristics of the substrate, including such properties as the space-charge capacitance, $C_{sc}$, the surface charge density, $Q_{ss}$, the doping concentration, $N_{sc}$, the surface recombination lifetime, $\tau$, the net doping concentration, and the surface recombination rate. These optically generated electrical effects are measured to determine the characteristics at a coordinate location or site of the substrate, as a result of the species deposited by the beam on the substrate by the beam implanter 202 at the coordinate location. The measuring device 204 may be positioned above to the first side 220 of the substrate 206 as show in FIG. 1, or in an alternative embodiment, the measuring device may positioned below to the second surface 222 of the substrate 206 as discussed in FIG. 8 below.

A transport stage 208 and moving device 216 moves the monitor substrate 206 between the measuring device 204 and the beam implanter 218 (shown as phantom monitor substrate 206'). The transport stage 208, which may be for example a platen, is actuated by the moving device 216. There may be many additional substrates 206 disposed on the transport stage 208, or there may be as few as one substrate disposed on the transport stage 208. In operation, the transport stage 208 may be any device, which moves the substrate relative to the implanter and measuring device. For example, the transport stage may be a conveyor belt, a robotic arm, a wafer chuck, a rotating disk, a ring, a turntable such as revolvable platform or similar device. In one embodiment, the moving device 216 provides linear movement of the transport stage in one direction (shown as arrow x) and circular rotation of the transport stage (shown as arrow R) within the transport stage's plane of orientation relative to the implanter 202 and the measuring device 204. The moving device 216 may optionally provide for vertical movement of the transport stage in the z-direction of orientation. The moving device 216 conveys to the controller 212 the positional encoding of the location or site on the substrate where the beam implanter deposited dopant species in the substrate some time (e.g. 30 to 500 milliseconds) prior to measurement. These measurements are used to adjust the beam implanter 202, thus allowing for real-time adjustment of the species deposited on a site or location of the substrate. The measurements may optionally be stored in the computer 210 for non real-time applications.

Figure 2:
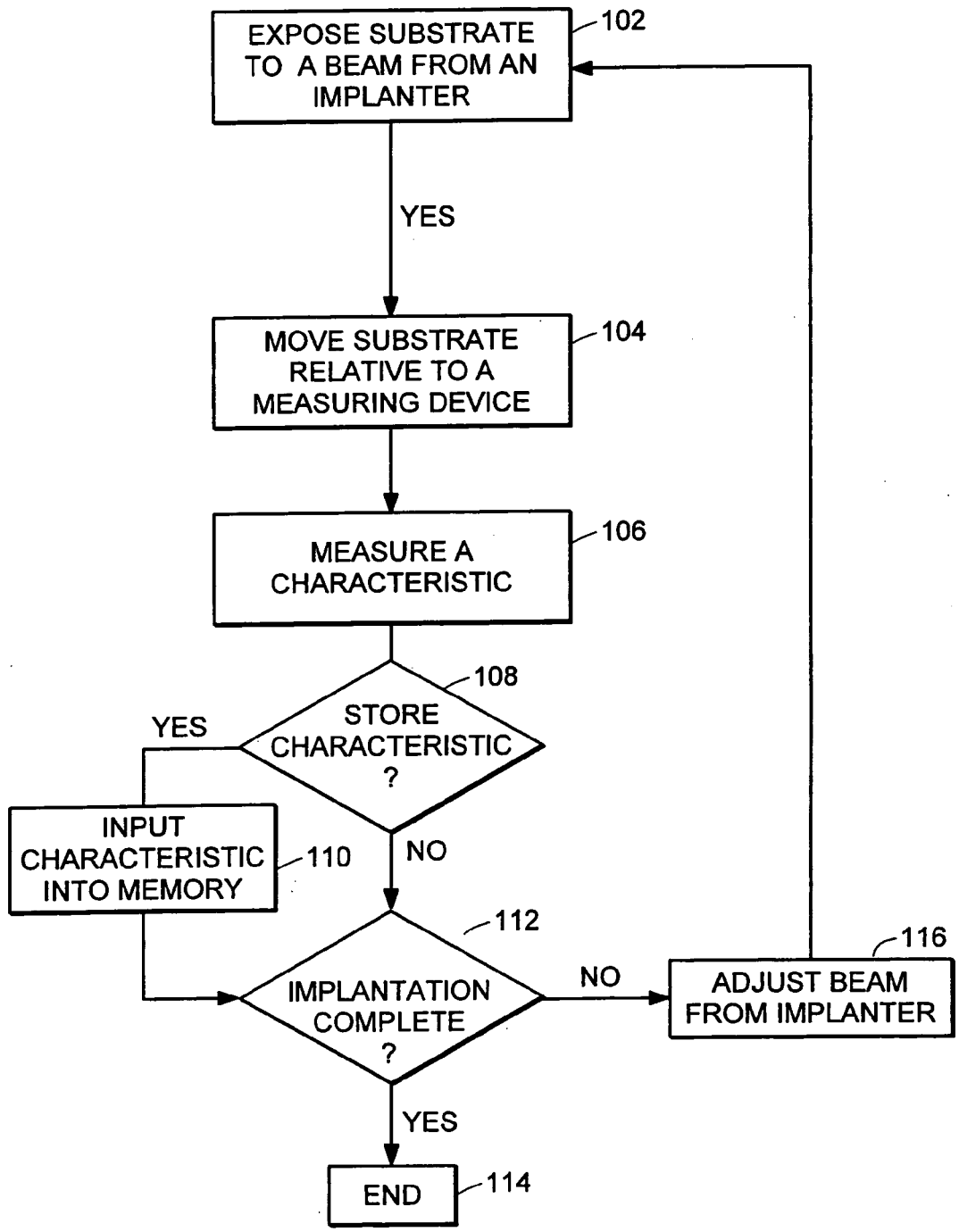
FIG. 2 is flow chart showing the steps of an embodiment of the implant system for implantation and measurement incorporating a feedback loop to adjust the implantation dose of a substrate.

FIG. 2 is a flowchart showing an embodiment of the method for applying the measuring device into the general implant system. In the preferred embodiment, this method is carried out within a vacuum chamber during the implant process. First, a portion of the substrate is exposed to a beam from a beam implanter 102. At step 104, a mover moves the substrate relative to a measuring device and then electrical properties of the substrate are measured at step 106. These electrical properties are used to determine characteristics of the substrate that resulted from exposing the substrate to the beam implanter at step 102. Optionally, these characteristics and/or electrical properties may be stored by a computer at step 110. If the implantation is complete, the process will end at step 114. However if the electrical properties of the substrate need further adjustment, then the beam implanter will be adjusted at step 116, and the exposing and measuring process will repeat. The substrate will continue to be exposed to the adjusted beam from the implanter until the measured electrical properties fall within the desired parameters. This feedback loop provides for make-up dose implantation or limits the area of overdosing on a substrate to improve dose uniformity and control.

In an alternative embodiment, the system may be used for adjusting the electrical properties of the substrate albeit not in substantially 100% real-time as described above. In such an embodiment, when the substrate is first exposed to a beam from an implanter 102, the implanter implants the substrate to near completion. By way of example, the implanter may perform what is believed to be 100% of the necessary implantation during the exposing step 102. During this implantation step 102, implantation is controlled using time integration of the ion beam current. A mover then moves the substrate relative to a measuring device 104. As described above, the measuring device measures a characteristic of a portion of the substrate. Alternatively the measuring device may map the characteristics of substantially the entire substrate. The mapping resolution will be determined by the size and sensitivity of the measurement head's sensor. The measured characteristic (or characteristics) is stored into the memory of a computer at step 110. At step 116, the measurements are then used to adjust the beam from the implanter to ensure the correct characteristics exist across the substrate, and the entire substrate is again exposed to the beam implanter modulated by the stored characteristic measurements, to achieve what is believe to be 100% necessary implantation uniformity over the exposed surface of the wafer.

In one illustrative embodiment, the implantation is carried out in a vacuum chamber, but the measurements are carried out in atmosphere. In such an embodiment, the measurements are not necessarily made in real-time after implantation. For example, a substrate 206 is transported outside a vacuum chamber and measured by the measuring device 204. The substrate is then conveyed to the vacuum chamber where it is implanted by the beam implanter 202. The wafer is then transported out of the vacuum chamber where the measuring device 204 measures electrical properties of the substrate.

Figure 3B:
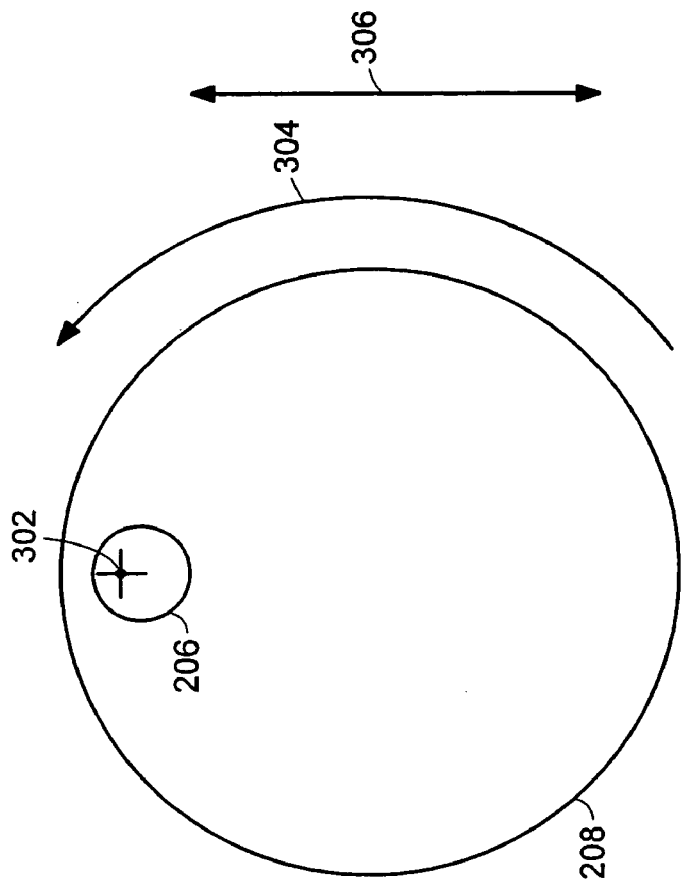
FIGS. 3A and 3B are top perspective views of the implant apparatus of FIG. 1 showing the coordinate location on the substrate used for positional encoding.
Figure 3A:
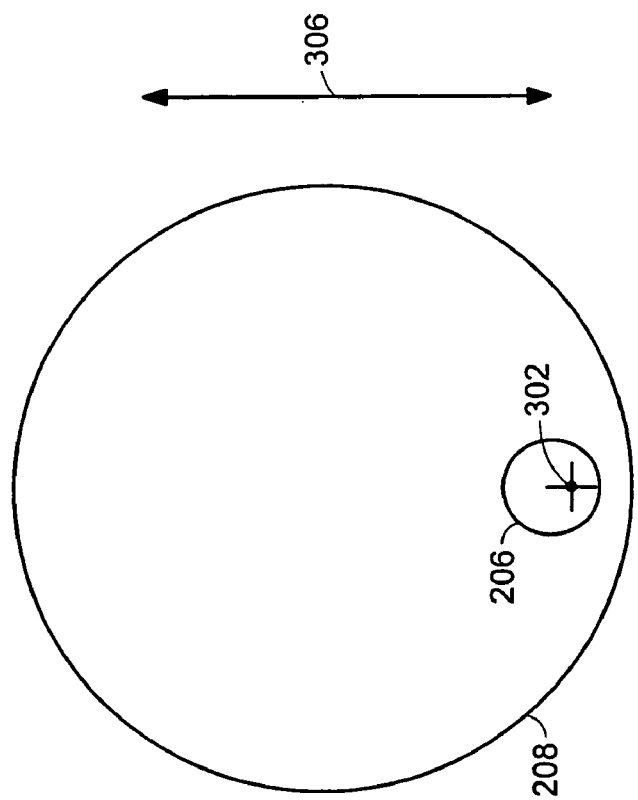

FIGS. 3A and 3B show a top perspective view of an illustrative embodiment of the implant apparatus. As shown in FIG. 3A, a monitor substrate 206 is disposed on the transport stage 208. There may be a batch of product wafers disposed on the transport stage. The positional encoding of the substrate records the coordinate location on the substrate 302 where the beam from the beam implanter deposited species on the substrate. The transport stage moves in a rotary direction. The substrate rotates along in the direction of selected rotation 304 relative to the beam implanter and measuring device in response to the rotary movement of the transport stage 208. In one embodiment, the substrate rotates at a speed greater than 100 rpm. In another illustrative embodiment, the substrate rotates at 1000 rpm. The rotary movement of the substrate enables the beam implanter to implant species at a desired location, such as coordinate 302, and the measuring device to measure the electrical properties that result from the beam implantation at the coordinate location 302 on the substrate. As described above, time between exposure of a portion of the substrate to the beam implanter and of the same portion to the measuring device may be between 30 and 500 milliseconds. In addition, the transport stage moves the substrate in a linear fashion 306. The linear movement is along the x-axis 306 in the same plane as the rotation of the substrate. The linear movement of the substrate is calibrated at any predetermined frequency. By way of example, the linear movement may be any frequency greater than 0.5 Hz, and in a one embodiment the linear movement is at a frequency of about 1 Hz. The linear movement of the substrate enables shifting positions on the substrate to be exposed to the beam implanter and subsequently measured by the measuring device. This combination of rotary motion and linear motion permits the beam to impinge on all portions of the substrate 206 over time.

Figure 4:
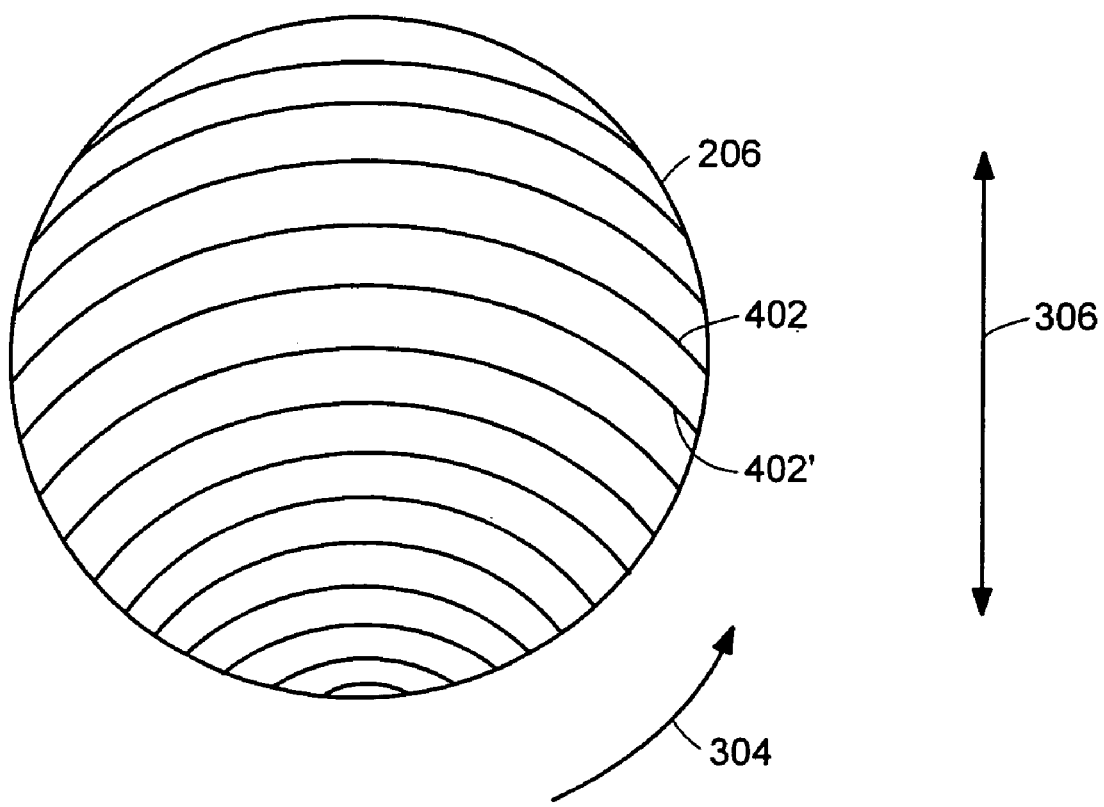
FIG. 4 is a top perspective view depicting the arc scan pattern resulting from rotary and linear movement of the substrate.

FIG. 4 depicts the resulting arc scan pattern of a circular substrate 206 that has been exposed to the beam implanter 202 or the measuring device 204 via the transport stage 208 that provides both rotary and linear movement of the substrate as described above. By way of example, the arc scan pattern 402 is created by exposing the substrate to the beam implanter and measuring device via the rotary movement 304 of the transport stage 208. The plurality of arc scan patterns is generated in responses to the linear movement of the substrate along the x-axis of motion 306. The linear movement facilitates shifting of the location of the arc scan pattern on the substrate along the x-axis 306, e.g. from 402 to 402'. The combination of rotary and linear movement of the substrate allows the beam implanter and measuring device to scan concentric arcs substantially across the surface of entire substrate.

Figure 5:
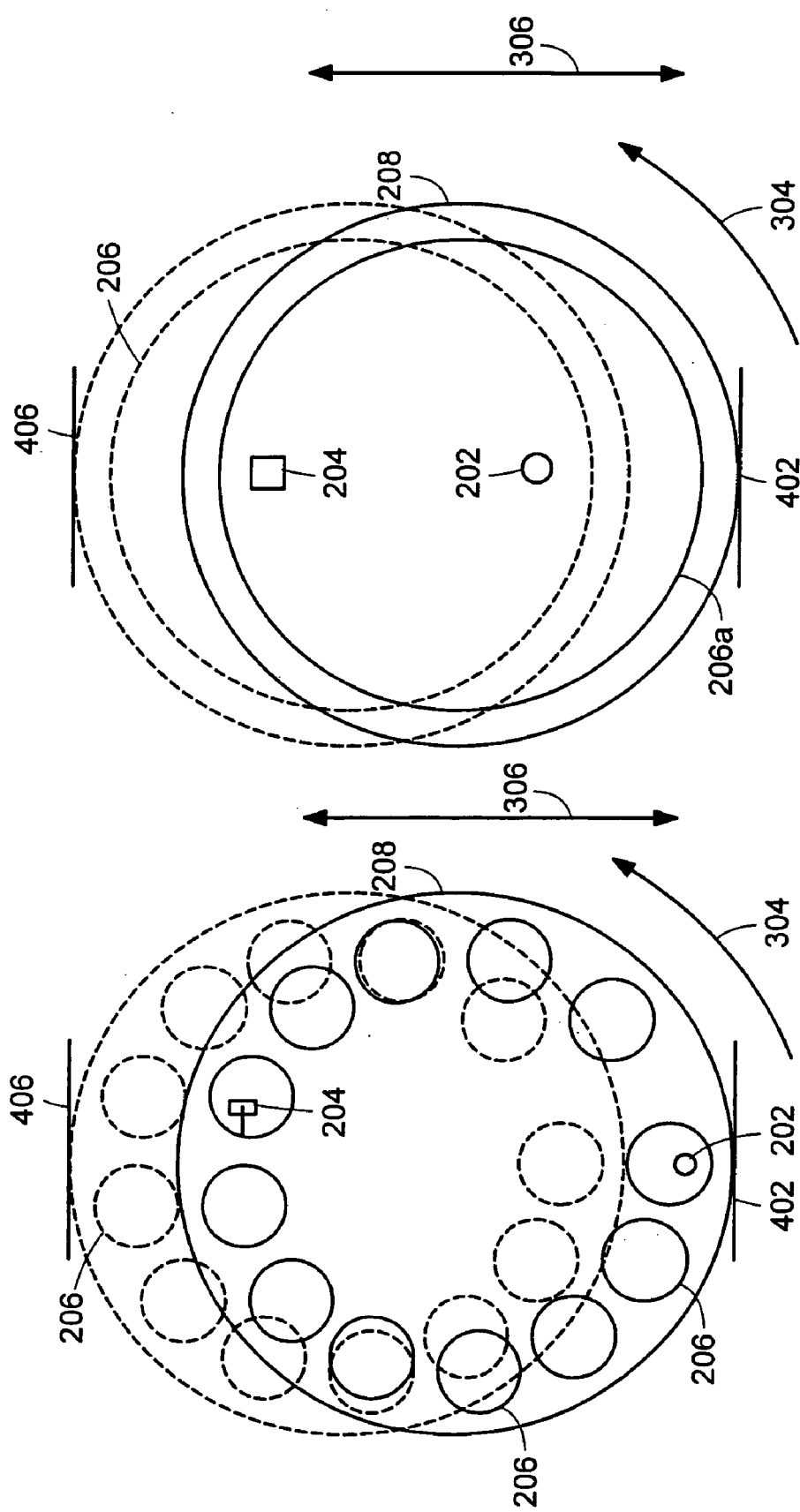
FIGS. 5A and 5B are a top perspective views of the implant apparatus of FIG. 1 showing the top linear scan position and bottom linear scan position.

FIGS. 5A and 5B depict embodiments of the apparatus illustrating the top linear scan position 406 and the bottom linear scan position 402 when the transport stage moves the substrates in the linear direction along the x-axis 306. The beam implanter 206 and measuring device 204 are stationary and disposed above the substrate. As the transport stage rotates 304, it also moves linearly from the bottom linear scan position 402 to the top linear scan position 406 or vice versa. This linear movement causes shifting of the arc scanned on each substrate along the x-axis of movement 306 as described with respect to FIG. 4. In one alternative embodiment, the transport stage 208 is calibrated to rotate approximately 60 times for every linear cycle of movement. One linear cycle being movement of the transport stage 208 from the bottom linear scan position 402 to the top linear scan position 406 and back to the bottom linear scan position 402. FIG. 5A shows an embodiment having a plurality of substrates 206 disposed on the transport stage 208. FIG. 5B shows an alternative embodiment, where one substrate 206a is disposed on the transport stage 208. The substrate 206a is substantially the same size as the transport stage 208. In other embodiments, the combination of linear and rotary motion is optionally replaced with a raster type beam scan over the substrate.

Figure 6:
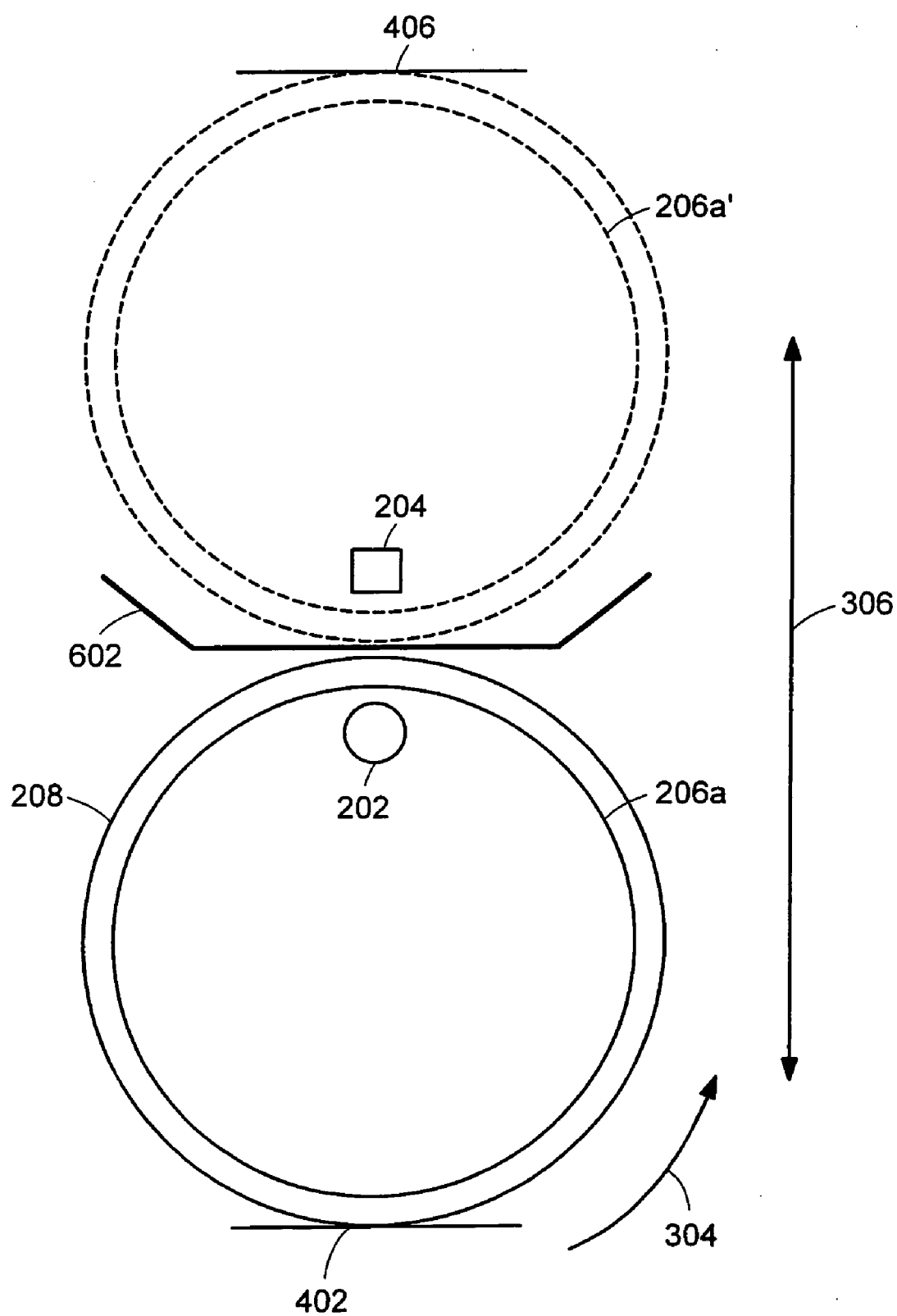
FIG. 6 is a top perspective view of an embodiment of the apparatus that incorporates a shield disposed substantially between the beam implanter and measuring device.

FIG. 6 is a top perspective view of an illustrative embodiment of the apparatus incorporating a shield 602 and having a single substrate 206a disposed on a transport stage 208 of similar diameter as the substrate 206a. In this embodiment, the stationary beam implanter 202 is disposed substantially adjacent to the measuring device 204. As the substrate rotates and moves linearly relative to the measuring device 204 and beam implanter 202, a portion of the substrate 206a is continuously exposed to the beam implanter 202. The shield 602 prevents back-splash from the beam implanter 202 from interfering with the operation of the measurement device 204. As described above, the substrate 206a rotates 304 and moves in at least one linear direction 306 to expose substantially the entire surface of the substrate to the beam implanter 202 and the measuring device 204. In an alternative embodiment, the measurement device is disposed adjacent to the backside of double polished wafers on implant platen to perform the measurements, as described in FIG. 8, eliminating the need for a shield.

Figure 7A:
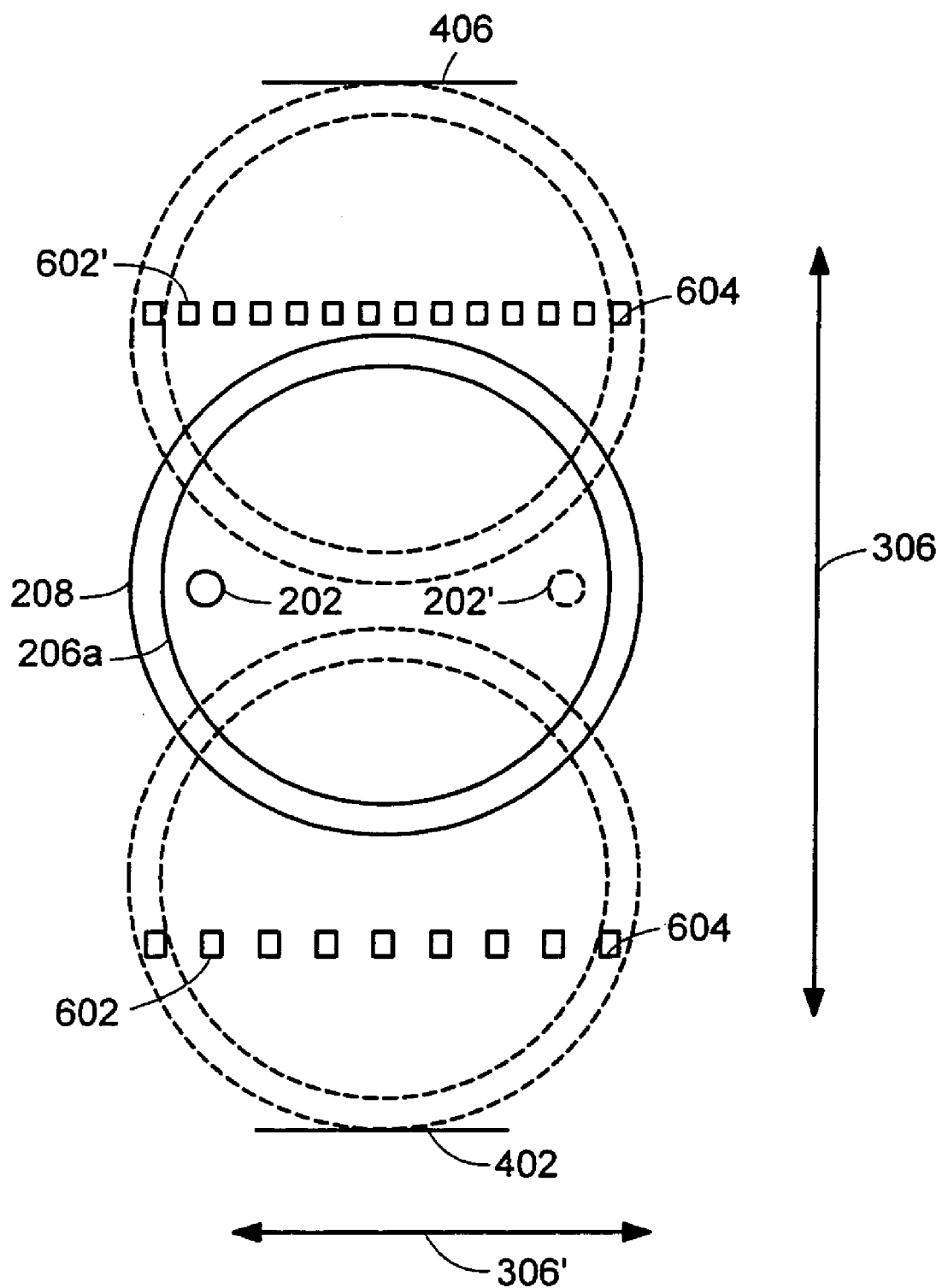
FIGS. 7A and 7B are top perspective views of an alternative embodiment of the implant apparatus having a single substrate disposed adjacent to the transport stage.
Figure 7B:
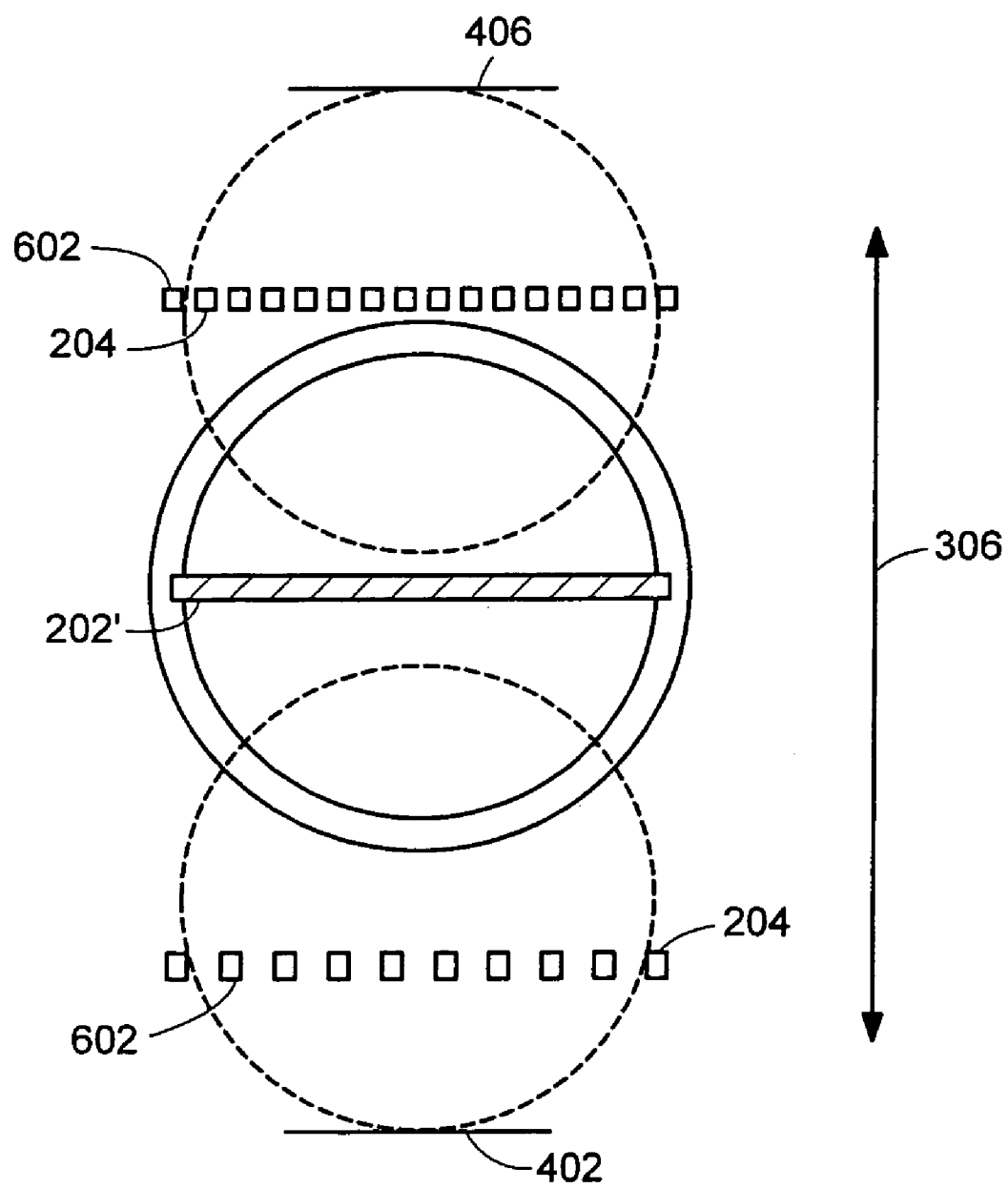

FIGS. 7A and 7B show top perspective views of the implant apparatus having a single substrate disposed adjacent to the transport stage. In this illustrative embodiment, a substrate 206a is disposed adjacent to a transport stage 208. The beam implanter 202 is disposed above the substrate and substantially near the center of the substrate. Two arrays of the measuring devices 602, 602' are disposed adjacent to said substrate 206a. Each array includes a plurality of sensors 604, which allow for measurement to be taken on a plurality of portions of the substrate simultaneously. In an alternative embodiment, measurements may be taken on the backside on double sided polished wafers as described below in FIG. 8.

By way of example, each sensor may be a measuring device 204 as described in FIG. 1. Each array 602, 602' is disposed substantially near an edge of the substrate when the beam implanter 202 is disposed substantially near the center of the substrate. In addition, in one alternative embodiment, each array is disposed on an opposing edge of the substrate. In such an embodiment, when the transport stage moves the substrate in a linear direction along the x-axis 306 though one linear cycle, each half of the substrate is exposed twice to a respective array 602, 602'. In one embodiment, the resolution derived from each array 602, 602' is at one millimeter. In the embodiment shown in FIG. 7A, the beam implanter 202 moves in a direction perpendicular to the linear direction of motion of the transport stage 306, i.e. the beam implanter 202 moves along the y-axis 306' whereas the transport stage moves along the x-axis of motion 306. The beam generated from the beam implanter hits a portion of the substrate normal to the plane of the substrate 206a. FIG. 7B shows an alternative embodiment of the apparatus where the beam implanter 202 is a stationary beam implanter that spans the entire diameter of the substrate.

Figure 8:
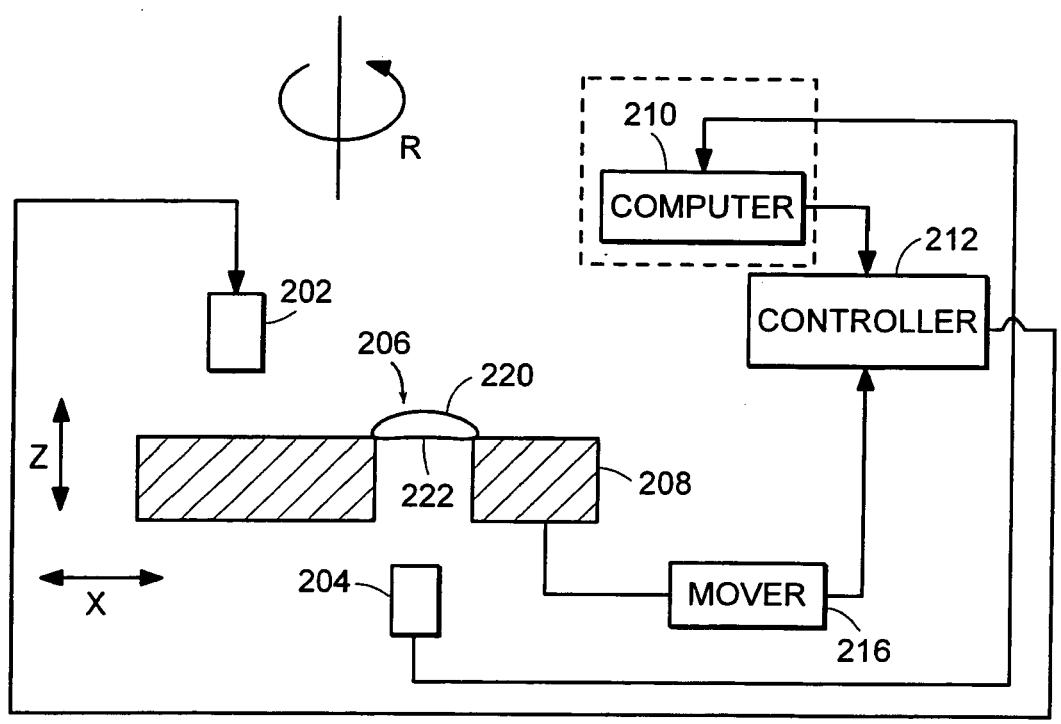
FIG. 8 is a side perspective view of an illustrative embodiment of the implant apparatus where the measuring device measures characteristics on the second surface of the substrate.

In another illustrative embodiment of the implant apparatus as shown in FIG. 8 (side view), the measuring device 204 is disposed in an alternative location. In this alternative embodiment, the measuring device is disposed adjacent to the second surface 222 of the substrate 206 located on the transport stage 208. In this embodiment, the specific configuration is such that the sensor is adjacent to the wafer through the transport stage. For example, the stage 208 is a ring stage which receives the wafer for measurement on its second surface 222. This illustrative embodiment provides for improved signal to noise measurements because the measuring device 204 measures electrical properties of the second side 222 of the substrate 206. The substrate is a double side polished wafer, devoid of patterned features. The high speed of photo-generated charges from the measuring device 204 reflect the first surface 220 to the second surface (backside) 222 of the substrate. In such an embodiment, the first surface 220 may be electrically grounded, and the second surface 222 may be floating.

Variations, modifications, and other implementations of what is described herein will occur to those of ordinary skill in the art without departing form the spirit and the scope of the invention as claimed. Accordingly, the invention is to be defined not by the preceding illustrative description, but instead by the spirit and scope of the following claims.

What is claimed:

1. A method for controlling implantation of a substrate in real-time comprising the steps of: exposing a portion of said substrate to a beam from an implanter; moving said portion of said substrate relative to a measuring device; measuring a characteristic of said portion of said substrate using said measuring device; and adjusting said beam from said implanter in real-time in response to said measured characteristic, wherein said portion of said substrate comprises a plurality of portions, wherein each portion comprises a location on said substrate, wherein said measuring device comprises a plurality of sensors, and wherein said measurement occurs on said plurality of portions simultaneously.

2. The method according to claim 1 further comprising the step of moving said portion of said substrate relative to said beam from said implanter.

3. The method according to claim 2 further comprising the step of exposing said substrate to said adjusted beam from said implanter.

4. The method of claim 1 wherein said moving step comprises rotating said substrate.

5. The method of claim 4 wherein said substrate rotates more than 100 rpm.

6. The method of claim 1 wherein said moving step comprises linearly moving said substrate.

7. The method of claim 6 wherein said linear movement of said substrate occurs at a frequency greater than 0.5 Hz.

8. The method of claim 1 wherein said moving step comprises rotating said substrate and linearly moving said substrate.

9. The method according to claim 1 wherein said adjusting step is in response to said measurement and said location of each respective portion on said substrate.

10. The method according to claim 1 wherein said implanter generates an ion beam.

11. A method for controlling implantation of a substrate comprising the steps of: exposing a portion of said substrate to an implanter; moving said portion of said substrate relative to a measuring device; measuring a characteristic of said portion of said substrate using said measuring device; storing said measured characteristic in memory; and adjusting said implanter in response to said stored measured characteristic, wherein said portion of said substrate comprises a plurality of portions, wherein each portion comprises a location on said substrate, wherein said measuring device comprises a plurality of sensors, and wherein said measurement occurs on said plurality of portions simultaneously.

12. The method according to claim 11 wherein said implanter generates an ion beam.

13. The method according to claim 11 further comprising the step of moving said portion of said substrate relative to said implanter.

14. The method according to claim 11 further comprising the step of exposing said substrate to said beam of said implanter.

15. The method according to claim 11 wherein said adjusting step is in response to said stored measurement and said location of each respective portion on said substrate.

* * * * *